(12) United States Patent
Watts et al.

(10) Patent No.: US 10,775,559 B2
(45) Date of Patent: Sep. 15, 2020

(54) PHOTONICS FABRICATION PROCESS PERFORMANCE IMPROVEMENT

(71) Applicant: Analog Photonics LLC, Boston, MA (US)

(72) Inventors: Michael Robert Watts, Hingham, MA (US); Benjamin Roy Moss, Brookline, MA (US); Ehsan Shah Hosseini, Milton, MA (US); Christopher Poulton, Cambridge, MA (US); Peter Nicholas Russo, Somerville, MA (US)

(73) Assignee: Analog Photonics LLC, Boston, MA (US)

( * ) Notice: Subject to any disclaimer, the term of this patent is extended or adjusted under 35 U.S.C. 154(b) by 0 days.

(21) Appl. No.: 16/385,871

(22) Filed: Apr. 16, 2019

(65) Prior Publication Data
US 2019/0243081 A1    Aug. 8, 2019

Related U.S. Application Data

(60) Provisional application No. 62/658,760, filed on Apr. 17, 2018.

(51) Int. Cl.
*G02B 6/12* (2006.01)
*G02B 6/42* (2006.01)
(Continued)

(52) U.S. Cl.
CPC .............. *G02B 6/12* (2013.01); *G02B 6/428* (2013.01); *G02B 6/4239* (2013.01); *G02B 6/4245* (2013.01); *G02B 7/008* (2013.01); *G02B 27/0068* (2013.01); *G02B 27/0087* (2013.01); *G02F 1/011* (2013.01); *H01S 5/02268* (2013.01); *H01S 5/02469* (2013.01); *H01L 21/56* (2013.01); *H01L 23/3121* (2013.01); *H01L 24/13* (2013.01); *H01L 24/16* (2013.01); *H01L 24/81* (2013.01); *H01L 31/105* (2013.01); *H01L 31/1804* (2013.01); *H01L 2224/13147* (2013.01); *H01L 2224/16145* (2013.01); *H01L 2224/48091* (2013.01); *H01L 2924/00014* (2013.01); *H01S 5/02252* (2013.01); *H01S 5/02276* (2013.01)

(58) Field of Classification Search
None
See application file for complete search history.

(56) References Cited

U.S. PATENT DOCUMENTS 5,783,854 A * 7/1998 Dries .................. H01L 27/0211
257/467
9,324,589 B2   4/2016 Pease et al.
(Continued)

*Primary Examiner* — Michael Stahl
(74) *Attorney, Agent, or Firm* — Young Basile Hanlon & MacFarlane, P.C.

(57) ABSTRACT

A plurality of waveguide structures are formed in at least one silicon layer of a first member. The first member includes: a first surface of a first silicon dioxide layer that is attached to a second member that consists essentially of an optically transmissive material having a thermal conductivity less than about 50 W/(m·K), and a second surface of material that was deposited over at least some of the plurality of waveguide structures. An array of phase shifters is formed in one or more layers of the first member. An array of temperature controlling elements are in proximity to the array of phase shifters.

20 Claims, 19 Drawing Sheets

(51) Int. Cl.
  *H01S 5/024* (2006.01)
  *G02B 27/00* (2006.01)
  *H01S 5/022* (2006.01)
  *G02B 7/00* (2006.01)
  *G02F 1/01* (2006.01)
  *H01L 23/00* (2006.01)
  *H01L 21/56* (2006.01)
  *H01L 31/18* (2006.01)
  *H01L 31/105* (2006.01)
  *H01L 23/31* (2006.01)

(56) References Cited

U.S. PATENT DOCUMENTS

| | | | |
|---|---|---|---|
| 9,476,981 B2 | 10/2016 | Yaacobi et al. | |
| 9,646,874 B1* | 5/2017 | Wojciechowski | H01L 21/764 |
| 9,740,079 B1* | 8/2017 | Davids | G02F 1/2955 |
| 2005/0169566 A1* | 8/2005 | Takahashi | G02F 1/011 |
| | | | 385/1 |
| 2007/0253663 A1* | 11/2007 | Keyser | G02B 6/12 |
| | | | 385/36 |
| 2009/0274418 A1* | 11/2009 | Holzwarth | B82Y 20/00 |
| | | | 385/30 |
| 2010/0187442 A1* | 7/2010 | Hochberg | G01S 7/4814 |
| | | | 250/492.1 |
| 2012/0213467 A1* | 8/2012 | Thacker | G02B 6/12007 |
| | | | 385/14 |
| 2013/0336613 A1* | 12/2013 | Meade | G02B 6/12 |
| | | | 385/14 |
| 2015/0253510 A1* | 9/2015 | Celo | G02B 6/3582 |
| | | | 385/14 |
| 2017/0371227 A1* | 12/2017 | Skirlo | G02F 1/2955 |
| 2018/0210394 A1* | 7/2018 | Favalora | H04N 13/305 |
| 2019/0235233 A1 | 8/2019 | Russo et al. | |

* cited by examiner

PHOTONICS FABRICATION PROCESS PERFORMANCE IMPROVEMENT

CROSS-REFERENCE TO RELATED APPLICATION(S)

This application claims the benefit of U.S. Provisional Application Ser. No. 62/658,760, entitled PHOTONICS FABRICATION PROCESS PERFORMANCE IMPROVEMENT THROUGH SILICON HANDLE REMOVAL, filed Apr. 17, 2018, the entire disclosure of which is hereby incorporated by reference.

TECHNICAL FIELD

This disclosure relates to photonics fabrication process performance improvement, for example, including procedures that may remove of at least a portion of a silicon substrate (also called a "silicon handle") from devices fabricated using advanced lithography and etching techniques, facilitating temperature management in a fabricated device.

BACKGROUND

The performance of many photonic circuits is often highly sensitive to temperature variations and thermal crosstalk between devices. Many modern photonic integrated circuits (PICs) are fabricated using advanced lithography and etching techniques originally developed for CMOS processes on top of a traditional silicon handle wafer. An example of a traditional PIC 10 fabricated on a silicon-on-insulator (SOI) wafer is shown in FIG. 1 (not to scale). The PIC 10 is packaged on a printed circuit board (PCB)/package 12, which uses an electrically conductive pathway, such as a wirebond 14, to provide electrical communication between electronic circuitry in the PIC 10 and circuitry in the PCB/package 12. The silicon in an SOI wafer is etched to form SOI structures 18 on a buried oxide (BOX) layer 16 that was provided on a surface of the SOI wafer (e.g., an oxide material such as silicon dioxide). The SOI structures 18 may include waveguides or other structures along with structures etched from material deposited or grown in different layers (e.g., germanium, silicon nitride, and/or metals), for example, to form devices that may include photonic and/or electronic functionality. Various layers can be stacked in a combined structure, for example, using oxide 20 that is deposited at various stages between the formation of different layers. In some cases, instead of embedding structures in oxide, there may be free-standing structures to enable mechanical movement (e.g., for MEMS devices). Before those structures are formed, the BOX layer 16 is bonded to a stiff supporting substrate in the form of a silicon wafer, called a silicon handle 22, which provides mechanical stability for the fabrication process. However, the presence of the silicon handle 22 potentially degrades the high-speed performance of radio frequency (RF) photonics chips by creating loss and parasitic effects on transmission lines and can lower the efficiency of optical edge coupling. Moreover, the relatively high thermal conductivity of silicon (compared to silicon oxide and nitride films) reduces the thermal isolation of adjacent devices. Therefore, if the temperature of a photonics device is to be controlled (for example for tuning the refractive index through thermal control), more power may need to be consumed for such control, and also adjacent photonic devices may suffer from thermal crosstalk through the thin BOX layer 16 and the silicon handle 22.

SUMMARY

In one aspect, in general, a method for fabricating a photonic integrated circuit includes: forming a plurality of waveguide structures in at least one silicon layer of a first member, the first member including: (1) a first surface of a first silicon dioxide layer that is attached to a second member that includes a silicon layer at least 100 microns thick, and (2) a second surface of material that was deposited over at least some of the plurality of waveguide structures; bonding a third member consisting essentially of an optically transmissive material having a thermal conductivity less than about 50 W/(m·K) to the second surface; removing most or all of the silicon layer of the second member; and forming an array of temperature controlling elements in proximity to an array of phase shifters formed in one or more layers of the first member.

In another aspect, in general, an article of manufacture includes: a plurality of waveguide structures formed in at least one silicon layer of a first member, the first member including: (1) a first surface of a first silicon dioxide layer that is attached to a second member that consists essentially of an optically transmissive material having a thermal conductivity less than about 50 W/(m·K), and (2) a second surface of material that was deposited over at least some of the plurality of waveguide structures; an array of phase shifters formed in one or more layers of the first member; and an array of temperature controlling elements in proximity to the array of phase shifters. The array of phase shifters is configured to emit a beam formed by interference of optical waves emitted from the phase shifters through an aperture that provides a transmissive pathway that does not include obstructive material within a distance of twice a beam radius from a propagation axis of the beam.

In another aspect, in general, a photonic integrated circuit includes: a plurality of waveguide structures formed in at least one silicon layer of a first member that includes: (1) a first surface of a first silicon dioxide layer that is attached to a portion of a second member that consists essentially of an optically transmissive material having a thermal conductivity less than about 50 W/(m·K), and (2) a second surface of material that was deposited over at least some of the plurality of waveguide structures; a laser module at least partially embedded within a portion of the first member; a heat sink thermally coupled to the laser module; an array of phase shifters formed in one or more layers of the first member; and an array of heater elements in proximity to the array of phase shifters. The array of phase shifters is configured to emit a beam formed by interference of optical waves emitted from the phase shifters through at least a portion of the second member.

Aspects can include one or more of the following features.

The material that was deposited over at least some of the plurality of waveguide structures consists essentially of silicon dioxide.

Most of the transmissive pathway is through the second member.

The first member comprises a wafer, and the second member comprises a wafer.

The heater elements are configured to reduce a thermal gradient in proximity to the phase shifters.

Aspects can have one or more of the following advantages.

Some implementations of the fabrication processes described herein are able to result in a packaged device 100 containing a photonic integrated circuit (PIC) supported by a thermally isolating handle wafer material, such as a glass wafer 130 (shown in FIG. 2), or a silicon handle with a sufficiently thick insulating layer of oxide much thicker than the BOX layer that may be found on some SOI wafers. The relatively high thermal conduction of silicon may be desirable for some applications (e.g., thermal switching, or heat flow to a heat sink), but there are some potential advantages to reducing thermal conduction. The lower thermal conduction of glass or thick oxide compared to silicon improves the thermal isolation of photonic devices. Even with the increased thermal isolation reducing thermal crosstalk between photonic devices, residual heat from coupled devices such as embedded lasers or attached electronic chips could potentially cause unwanted thermal gradients. The fabrication methods and device structures described herein facilitate thermal control of local refractive index to reduce potential aberrations in light emitted from photonic devices such as a phased array due to residual thermal crosstalk and/or thermal gradients (e.g., using an array of temperature controlling elements for temperature management, as described in more detail below). This processing method and device structure has an added benefit for vertically-emitting photonic circuits (such as a phased array); for such circuits, the glass handle can act as a protective cover and light can be emitted downward through the glass wafer 130, as shown by the example beam profile represented by the light emission pathway 101 in FIG. 2. The beam is able to pass through a clear transmissive pathway that does not include any materials such as silicon in proximity to the beam. In some traditional schemes, if an electronic bonded chip is controlling the photonics, the emitted light must go through either the electronic chip or through the silicon wafer used as a supporting substrate. Even though the silicon wafer is transparent at the infrared wavelengths, the high index contrast between the silicon wafer and air and oxide interfaces can lead to multiple reflections, interference patterns, total internal reflection at large emission angles and a host of other potentially unwanted and/or unpredictable features. By removing at least a portion of the silicon wafer that is used in initial stages as an initial supporting substrate and replacing it in a later stage with a low index, transparent supporting substrate, light can be emitted from the photonics structures in the PIC chip without having to go through the metals in the electronics structures in the PIC chip or the silicon of the initial supporting substrate. For example, structures through which optical waves are transmitted or guided can be highly transmissive for infrared or visible light, or electromagnetic waves having a peak wavelength that falls in a particular range (e.g., between about 100 nm to about 1 mm, or some subrange thereof), also referred to herein as simply "light." Moreover, coupling of integrated photonics devices in a PIC to standard optical fibers with relatively large cores (e.g., ~9 microns) potentially becomes easier without the presence of the full original thickness of the silicon handle at the proximity of the photonics devices.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

In addition to some of the fabrication stages used in a traditional fabrication flow, an alternative fabrication flow (which will be described with reference to FIGS. 3-8, 9A, 9B, and 10-15) incorporates various changes that result in a photonic integrated circuit with an ability to facilitate improved temperature management in a fabricated device, for example, using a thermally insulating handle. In some implementations, initial stages in the process include performing some steps that are also used in traditional front-end-of-line (FEOL) fabrication stages (e.g., material growth or deposition, and etching), and back-end-of-line (BEOL) fabrication stages (e.g., metalization).

Figure 1:
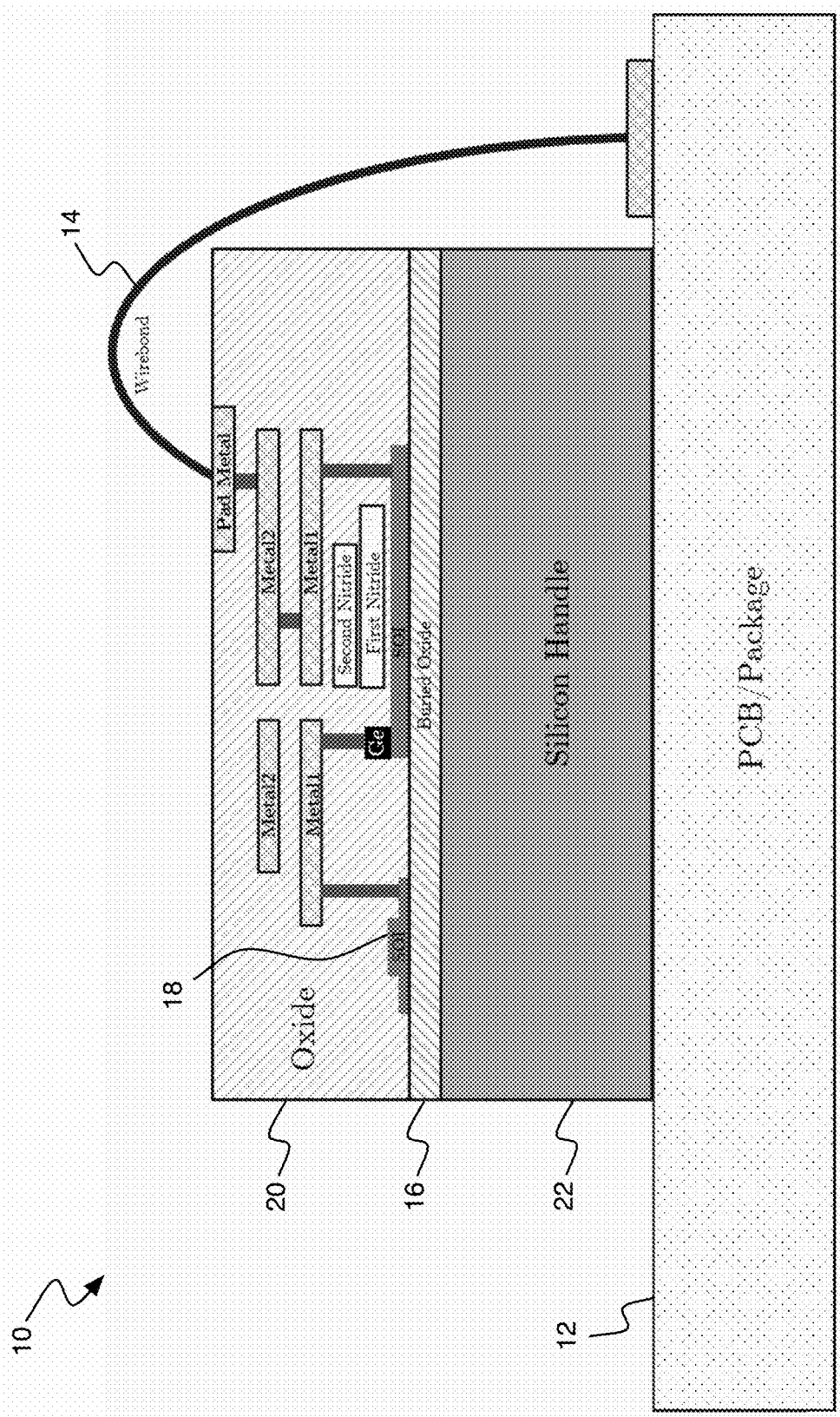
FIG. 1 is a schematic diagram showing an example of a packaged photonic integrated circuit manufactured using an SOI wafer based on fabrication techniques that are similar to prior art CMOS SOI fabrication.
Figure 2:
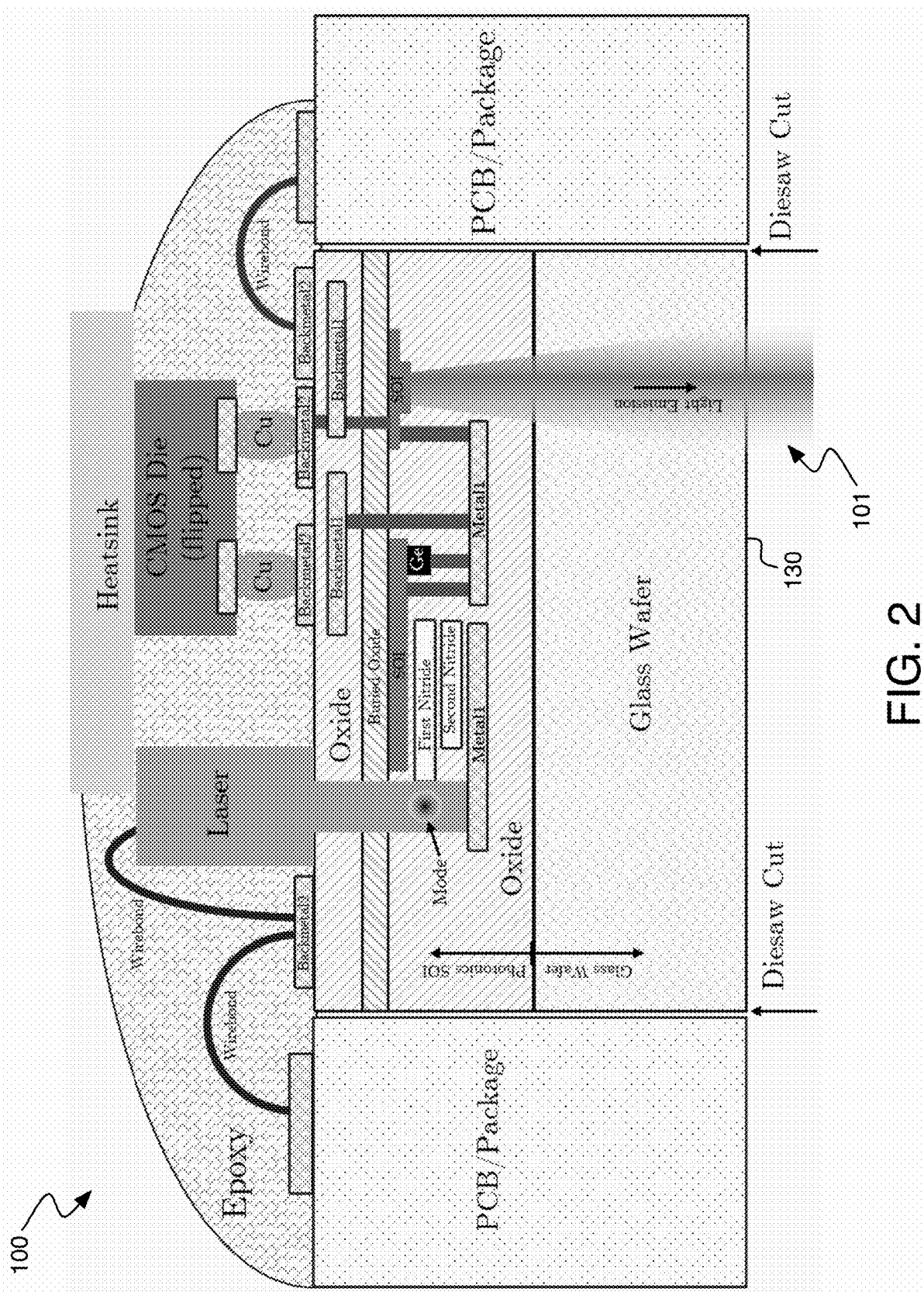
FIG. 2 is a schematic diagram showing an example of a packaged photonic integrated circuit with light emission through a glass handle.
Figure 3:
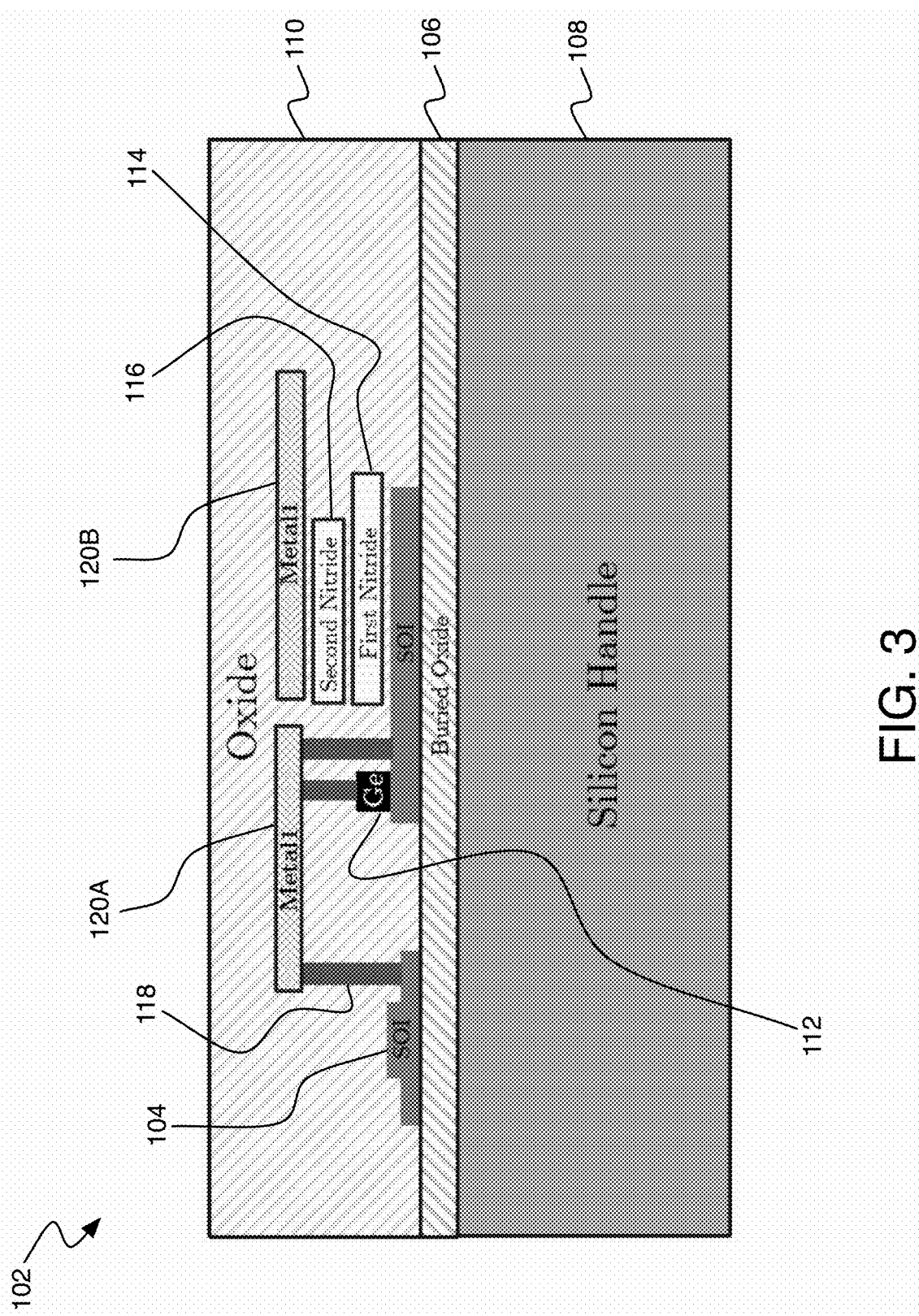
FIGS. 3-8, 9A, 10-14 are schematic diagrams showing examples of fabrication stages associated with a fabrication process for an example photonic integrated circuit.

FIG. 3 illustrates a cross-sectional view of a PIC 102 after initial stages of fabrication in an SOI process. At this point in fabrication, SOI structures 104 have been formed (e.g., around a few hundred nanometers thick) on a BOX layer 106 (e.g., around 2 microns thick). The BOX layer 106 has been bonded to a silicon handle 108. The thickness of the silicon handle 108 may have been selected to provide adequate mechanical support, which may be, for example, between around 100 microns to 1,000 microns, or more. Over multiple depositions, additional oxide 110 (e.g., silicon dioxide) is deposited between different layers of other material. In this example, a structure 112 has been formed from germanium. There are also multiple layers of nitride (e.g., silicon nitride) that have been formed with oxide between the layers, including a first nitride layer 114 and a second nitride layer 116. There have been conducting structures 118, called a through-oxide via or through-chip via, formed by drilling holes within the deposited oxide 110 and depositing metal in the holes. There has been a metal layer deposited that includes buried metal contacts 120A, 120B to provide conductivity to enable electrical connection between various structures. The metal can be deposited by forming trenches in the oxide 110 that are filled with a desired metal (e.g., copper) and processed using a chemical mechanical polish to reach a particular thickness. The metal can be used for conducting paths for electrical signals (e.g., rf signals or low frequency or DC signals). In the example shown, only one metal layer has been formed at this point in fabrication, which can be used for contacts to various devices (e.g., later in this example, as a landing contact for an embedded laser).

The SOI structures 104 can be etched to form geometries that can be used to propagate light as a waveguide layer; such as a partial etch to produce a ridge waveguide in the silicon. The nitride layers 114, 116 can also be etched to form waveguides or other structures that have different properties and serve different functions.

For example, different layers of waveguides or photonic device structures have different guiding properties that can be used for different purposes. Silicon waveguides may provide a higher index guiding layer that more tightly confines a guided mode and facilitates doped regions that provide desired functionality such as phase modulation, but may be more sensitive to surface roughness. Nitride waveguides may provide a lower index guiding layer that less tightly confines a guided mode and offers less sensitivity to surface roughness, index variation, or variation in structural height or width. The propagation loss may also be lower in nitride (e.g., 0.1 dB/cm) than in silicon (e.g., 2 dB/cm). Structures such as level shifters (not shown) can be used to shift light signals between different layers by adiabatically tapering material positions and/or thicknesses. A variety of alternative steps can be added or skipped in different examples. In some examples, it may be desirable at one or more stages in fabrication to at least temporarily skip the semiconductor doping, the addition of germanium 112, and/or the metallization. Doing so would allow the nitride layers to be annealed to reduce the waveguide loss, for example.

Figure 4:
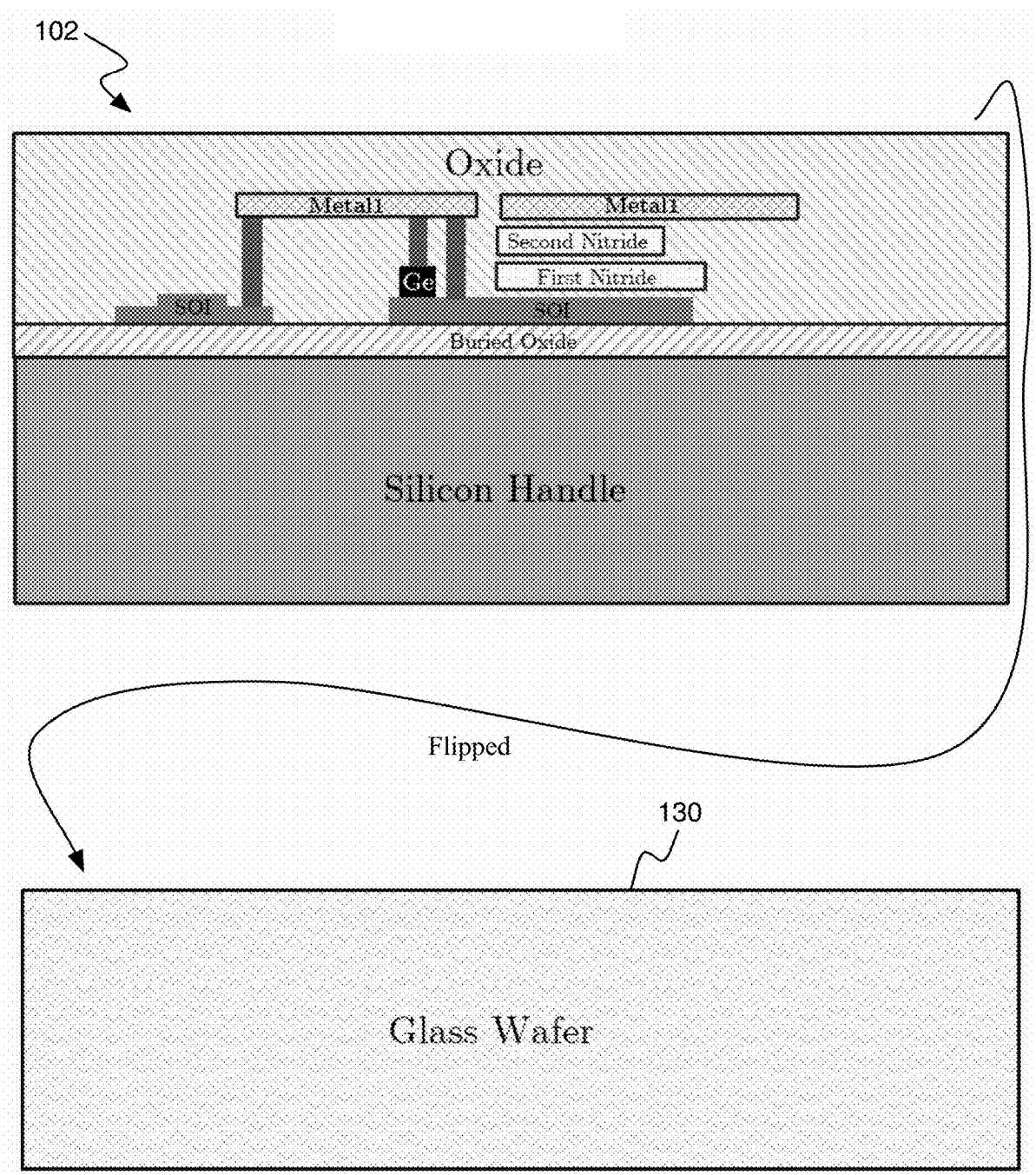

Referring to FIG. 4, a glass wafer 130 of the same diameter and compatible dimensions as the wafer on which the PIC 102 is formed (also called the "photonic wafer") can be fabricated for wafer-level bonding as a new supporting substrate. Glass that is composed essentially of silica (or any form of silicon dioxide similar to or identical to the oxide 110) may be chosen due to its low cost, its low thermal conduction to help thermally isolate photonic devices, and/or its optical transparency. Other materials (such as plastic, quartz, and sapphire) can be used instead of, or in addition to, glass, provided they are transparent at the desired wavelength and are sufficiently thermally insulating. The thickness of the new supporting substrate can be similar to the thickness of the silicon handle (e.g., greater than around 100 microns, or greater than around 500 microns) Other alternative materials that can be used for the new supporting substrate include a silicon wafer with a sufficiently thick layer of oxide (e.g., greater than around 100 microns, or greater than around 500 microns), which can also provide thermal isolation but not necessarily high optical transmission if the application does not require it.

Figure 5:
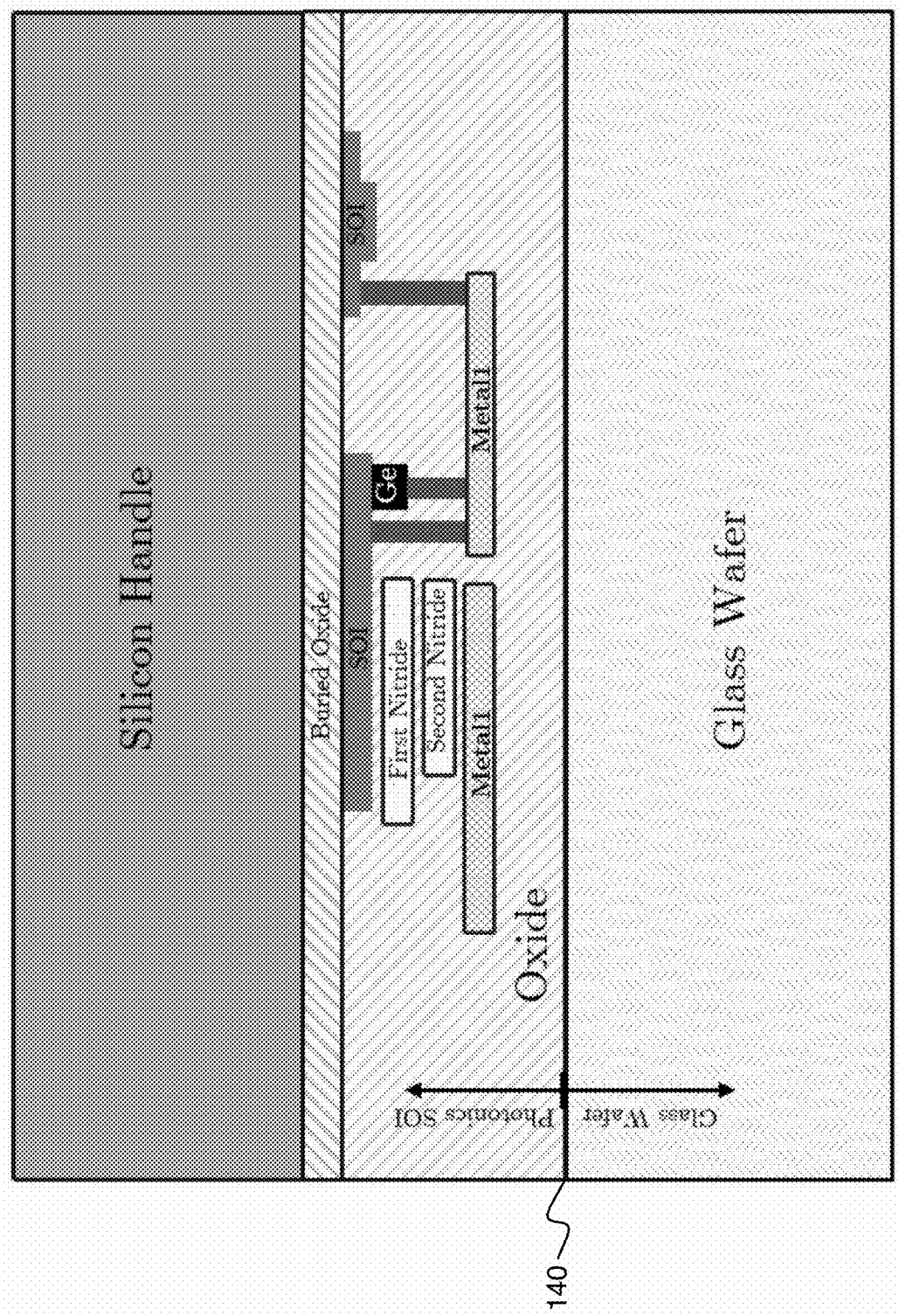

Another step in the fabrication process in this example is to flip and bond the photonic wafer onto the glass wafer 130 at a wafer-scale, shown in FIGS. 4 and 5. The lack of any features on the glass wafer 130 relaxes alignment requirements between the two wafers at a bonding surface 140 at which the two wafers make contact. The bonding can be performed using direct bonding, for example. In some alternative fabrication processes, the flipping and bonding may not be necessary if, for example, a silicon wafer is initially provided bonded to a glass or sapphire substrate. But, such wafers may be prohibitively expensive, and/or may not be as compatible with some standard CMOS processing stages that may rely on certain properties of a silicon handle (e.g., thermal and/or electrical conductivity).

Figure 6:
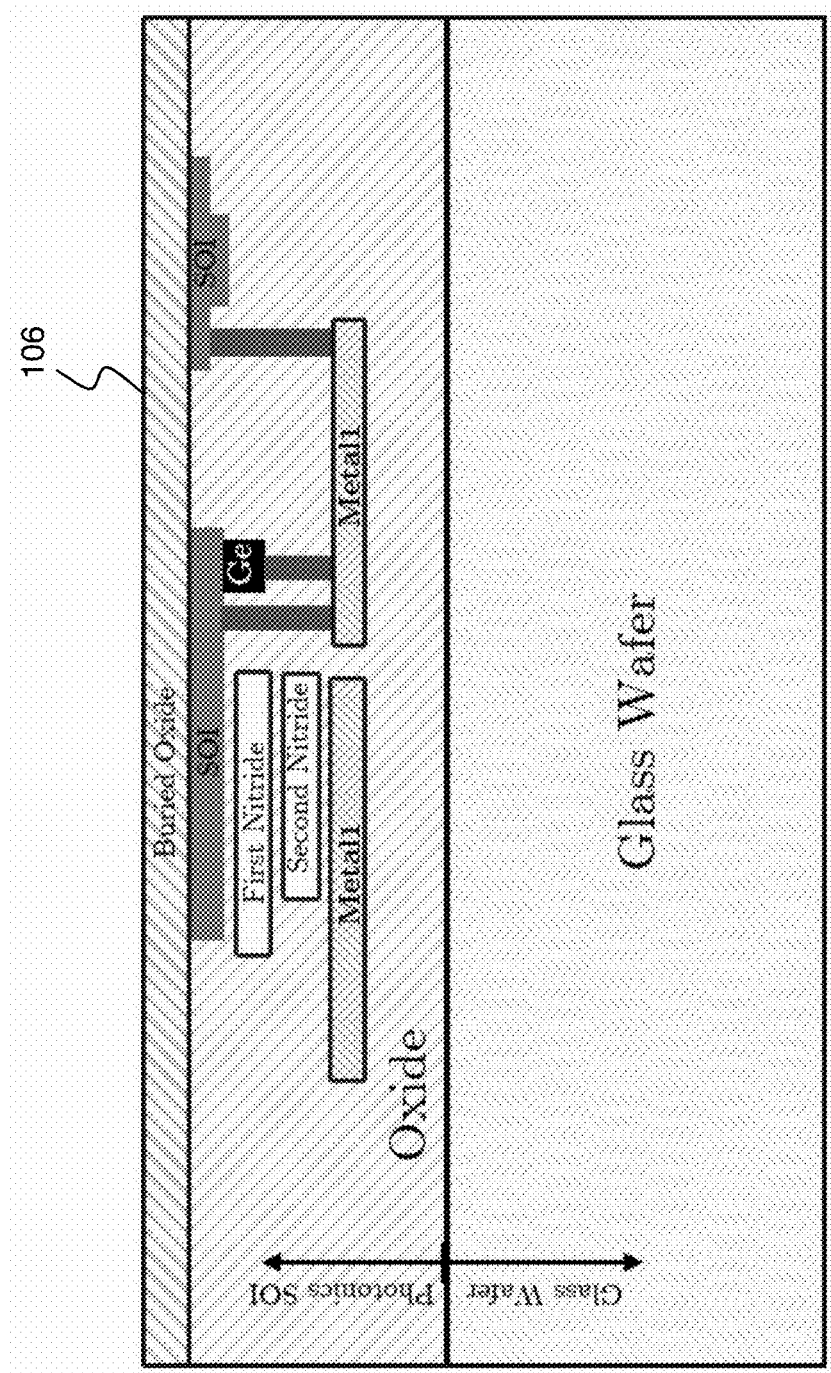

After the flipping and bonding, the silicon handle 108 is removed as shown in FIG. 6. The BOX layer 106 can be used as an etch-stop. For example, a portion of the silicon handle 108 can be removed by grinding down to a certain thickness. Then the remaining silicon can be etched away chemically or polished away. In some cases, the etching may remove a thin portion of the BOX layer 106 as well. Mechanical stability is provided by the replacement glass wafer 130.

If doping of the silicon was not performed during the initial fabrication stages (or additional doping is desirable such as when a vertical p-i-n junction is created with shallow and sharp doping profiles created by doping from the top and bottom), the BOX layer 106 can be stripped and the SOI structures 104 can be doped to produce active photonic devices. Similarly, if germanium was not added during FEOL fabrication stages (such as for the germanium structure 112), a hole can be drilled through the BOX layer 106 (or the BOX layer 106 can be completely removed) to add germanium for photodetector devices, for example. Similarly, germanium can also be grown from both the top and the bottom. For example, it is possible to create Ge—Si—Ge devices in which the mode of a guided optical wave is kept away from highly doped or metallic regions and only interacts with the intrinsic regions of germanium. This way, longer wavelengths (which are slower to be absorbed in germanium photodetectors) can travel a long distance inside the photodetector and gradually create a photocurrent without suffering free carrier absorption that wastes the optical energy without an electric output at the photodetector.

Figure 7:
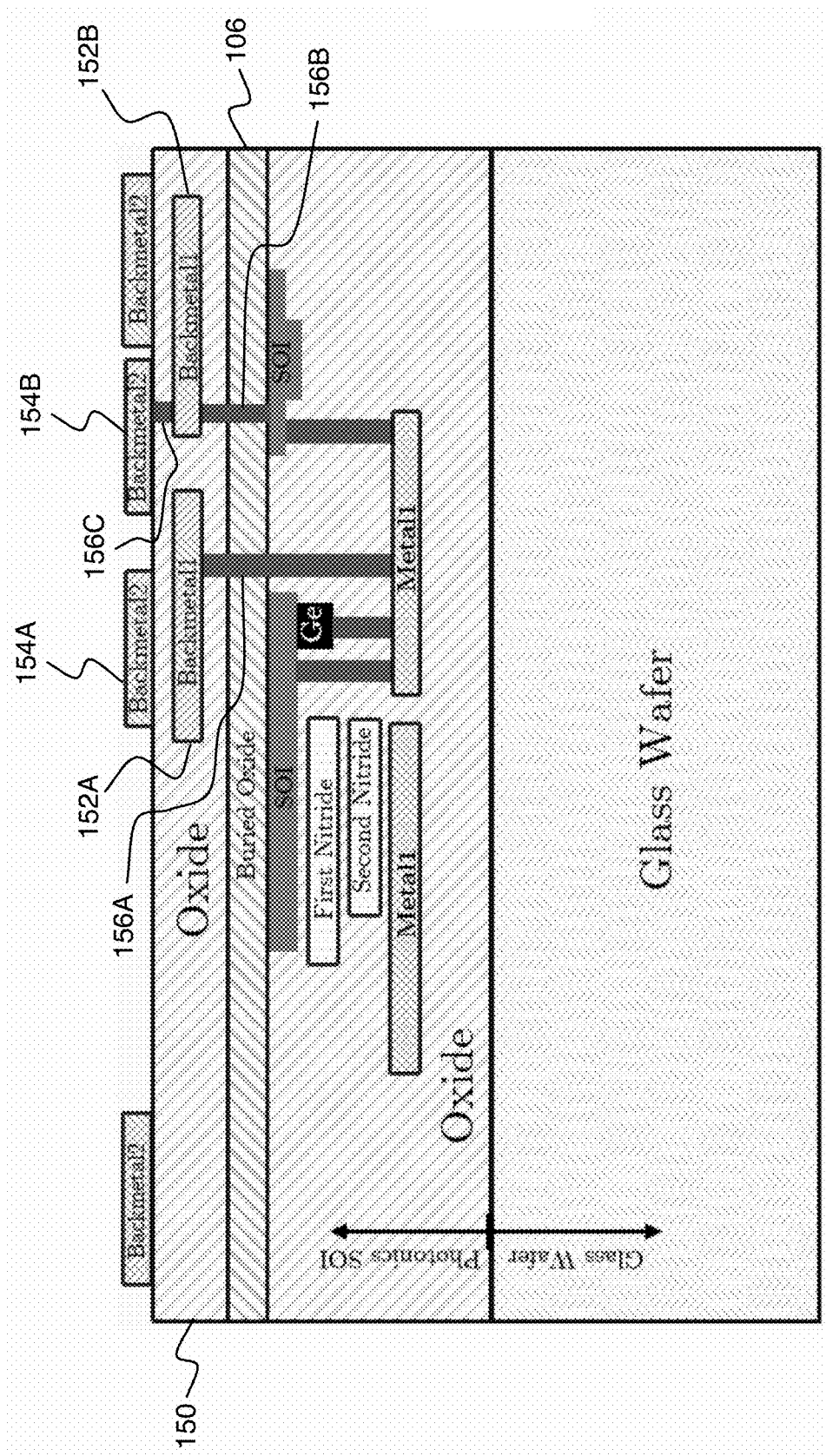

Referring to FIG. 7, the next stages in fabrication (e.g., BEOL fabrication stages) include adding metal connectivity on what is now the top surface of the wafer, with the additional of additional oxide 150 between different layers. If the BOX layer 106 has not been removed, then vias (also called through-oxide vias or through-chip vias) can be formed by drilling through the BOX layer 106, and the additional oxide 150, as needed. The drilled holes can be positioned to connect to doped SOI (for active photonic devices), and to connect to any existing metal layers to provide electrical connectivity to them. For example, a metal via 156A can be formed to connect the contact 152A to an existing metal layer, and a metal via 156B can be formed to connect the contact 152B to an existing SOI structure. Also, a metal via 156C can be formed to connect the contact 152B to the top contact 154B. Any number of metal layers can be fabricated at these stages. Two metal layers are shown in the example of FIG. 7, including metal contacts 152A, 152B at a layer named Backmetal1 and metal contacts 154A, 154B at a layer named Backmetal2. In other examples, the number of metal layers, both on the back side layer (top of the stack at this point in fabrication) such as Backmetal2, and at other internal layers below the back side, are expandable and may include a relatively large number of metal layers compared to this simple example containing only two additional layers (for the sake of brevity).

The examples presented here can be generalized to include any of a variety of fabrication stages, such as: multiple layers of metal, multiple doping operations, more than two layers of nitride on both top and bottom, multiple partial and full depth etch steps into the silicon (SOI) layer from both top and bottom, and additional amorphous and polycrystalline guiding layers. None of the additional options mentioned significantly changes the fundamental flow of the device fabrication presented here, and may only add a few additional fabrication steps to the basic flow described here.

In some implementations, a photonic system may be designed such that a PIC is fabricated to include an integrated laser module or gain module (such as a semiconductor optical amplifier also known as an SOA), but often the appropriate III-V materials for laser or gain module fabrication are not available in the CMOS compatible, silicon based photonic process. Other implementations may couple an external laser to the PIC using fiber coupling, which may improve certain features, such as heat isolation, but there may be tradeoffs such as coupling loss, increased system size, and reduced system stability. In some implementations structures in the PIC can be used to form part of a laser resonator cavity or loop. For example, a in an external cavity configuration a gain module (e.g., SOA) can be embedded and structures may be used as a reflector (e.g., a grating of a distributed feedback reflector) with the other reflector being a mirror facet of the gain module. In some implementations, a hybrid silicon laser can be formed from both silicon of the PIC and an embedded module containing III-V semiconductor material.

Figure 8:
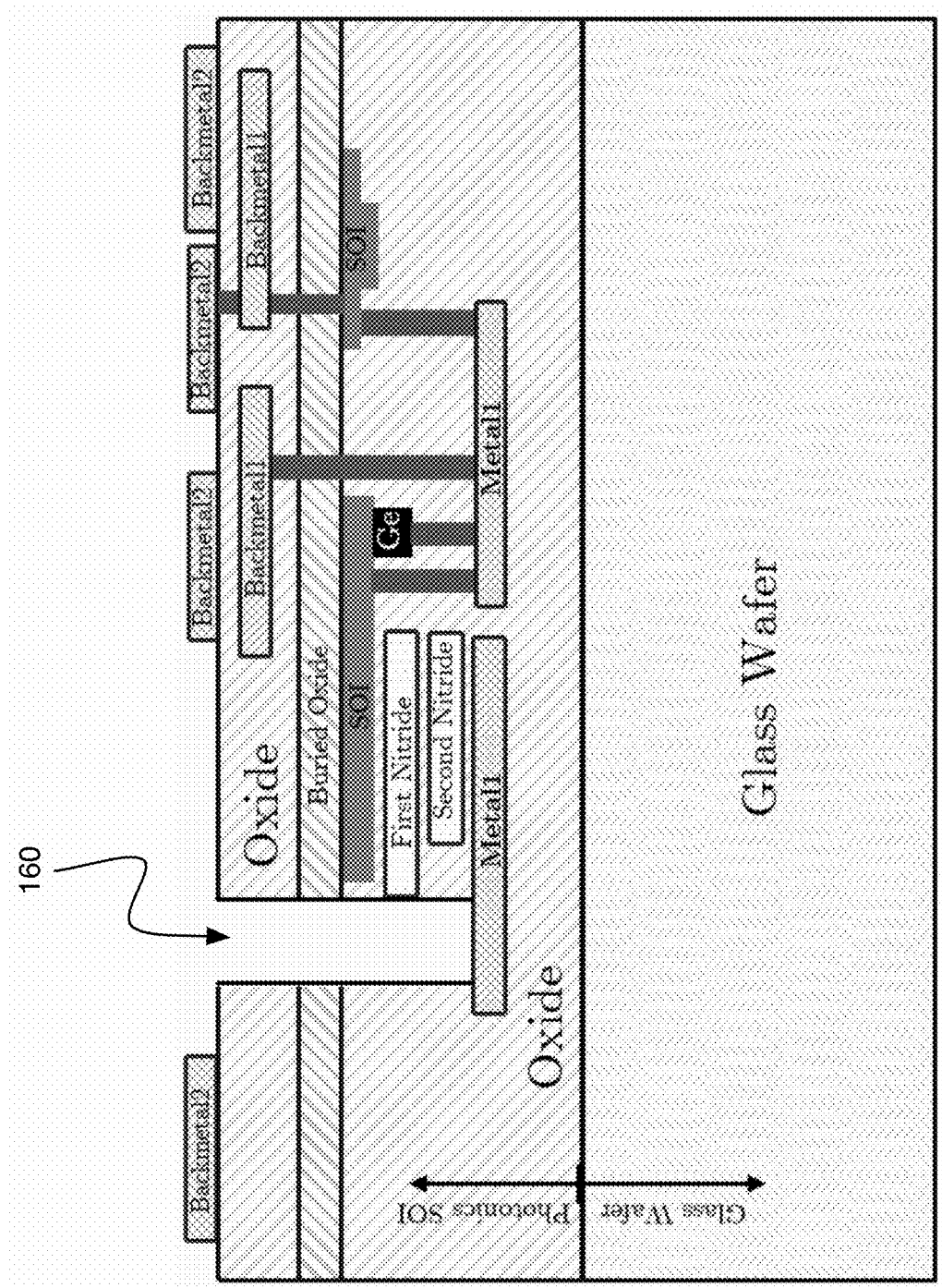

In this example, a separately fabricated laser module is bonded or embedded at a wafer scale (e.g., before the wafer has been diced to form an individual die) to couple light into an existing structure (e.g., a nitride waveguide). First, as shown in FIG. 8, a spatial cavity 160 is drilled. In this example, the drilling procedure uses the existing contact 120B at the Metal1 layer as an etch stop. The location of this cavity 160 can be carefully selected to ensure that there is sufficient isolation of the potentially significant heat that will be generated by the laser or gain module. For example, the laser or gain module can be located away from temperature sensitive structures or devices (e.g., a phased array) for which a large temperature gradient could produce an undesirable non-uniform phase distribution, as described in more detail below.

Alternatively, if a flow of fabrication stages results in no metals below the SOI structures, a large cavity can be etched, and metal can be deposited at the bottom of the cavity, as will be described below in reference to FIG. 9B. The cavity may be large enough to allow a wire bonding tip to reach to the bottom of the cavity after the laser has been attached. A resulting wirebond would form an electrical connection to the deposited metal. However, some implementations may allow for electrical connection without requiring a wirebond directly attached to the bottom of laser.

Figure 9A:
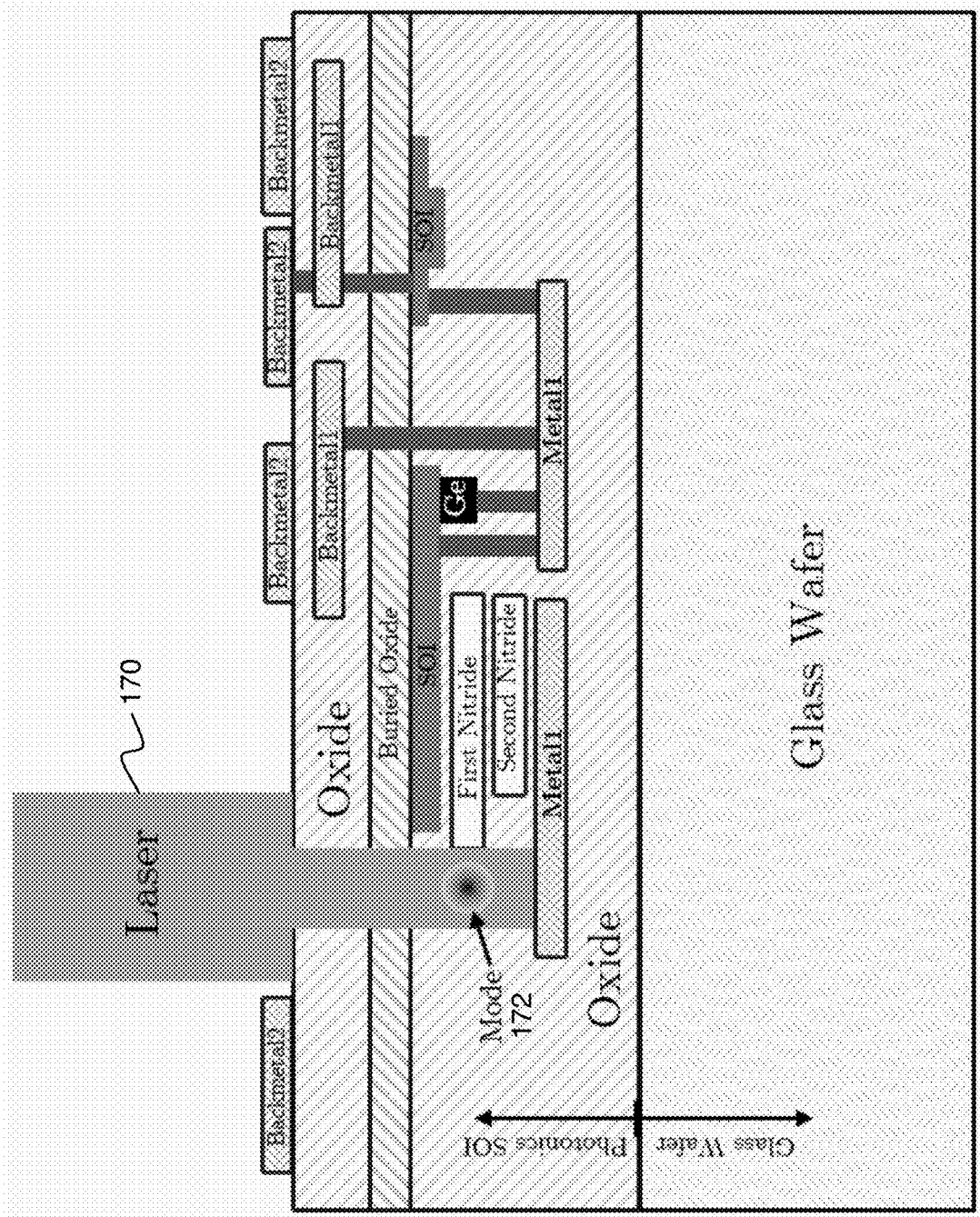
Figure 9B:
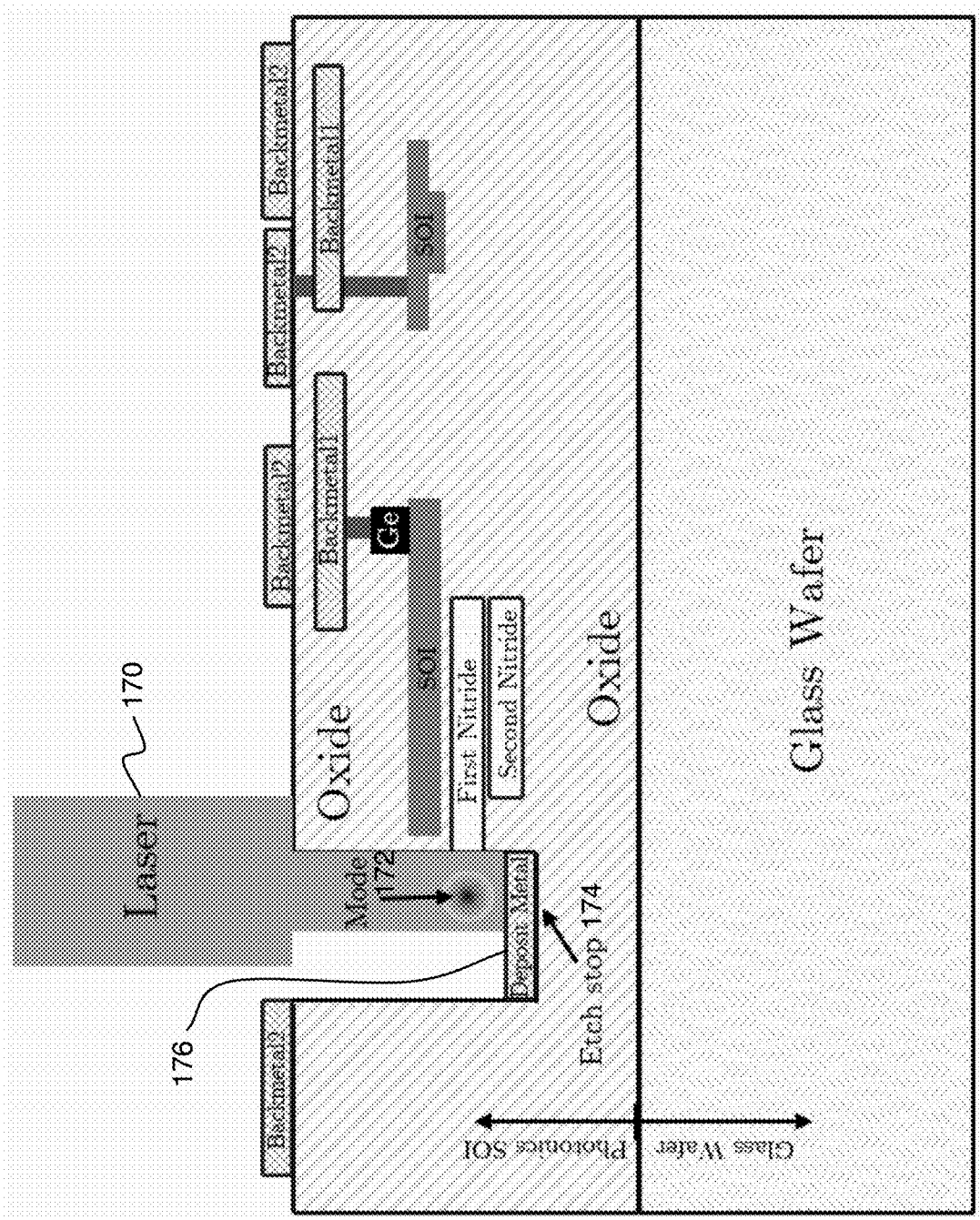
FIG. 9B is a schematic diagram showing an example of an alternative laser attachment manufacturing stage.

Referring to FIG. 9A, a laser module 170 is inserted into the cavity and attached to the photonics wafer. Alignment features can assist in alignment of the laser module 170 such that the transverse spatial mode 172 of the laser's output beam has a high overlap with a guided mode of a waveguide layer in the PIC. This waveguide layer could be a structure in a nitride layer, or an SOI layer, for example. In this example, the mode 172 of the laser is aligned with a mode of a waveguide in a nitride layer. Various techniques can be used to provide an etch stop alignment feature, and to ensure the III-V material epitaxial layer stack in the laser module 170 is properly aligned with respect to the etch stop so that the height of the mode 172 is vertically aligned to the guiding layer in the PIC. In some implementations, an etch stop on which a portion of the laser module can rest is based on a chosen layer in the PIC stack (such as a metal layer, or an SOI layer). FIG. 9B shows an alternative where an etch stop 174 corresponds to a position within the oxide that is not based on a pre-existing layer in the PIC stack, but includes a deposited metal pad 176 at a depth relative to the top surface that is compatible with the dimensions of the laser module 170. Also, the cavity drilled for receiving the laser module 170 and the dimensions of the laser module 170 allow space for a wirebond to provide an electrical connection to the metal pad 176 at the bottom of the cavity. In this alternative, the etch stop 174 is useful to prevent the cavity from being drilled too deep, and may help prevent contamination of fabrication equipment by certain materials (e.g., metals) at the bottom of the cavity, though the details of the alignment process may include other alignment features and may depend on the exact alignment features used. Additionally, other devices such as optical isolators could be attached to the wafer using a similar procedure.

Figure 10:
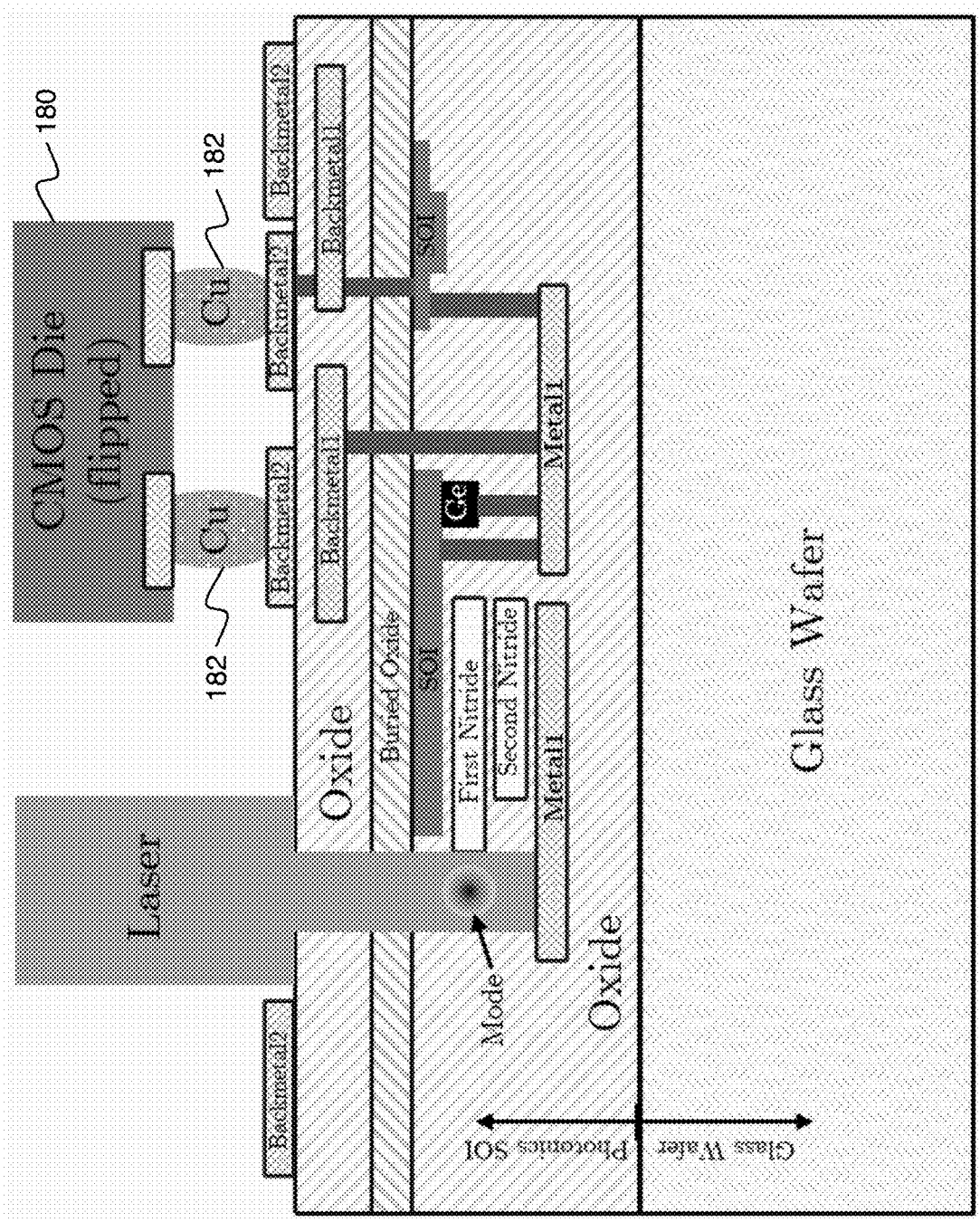

In some implementations, the photonic fabrication process may have the processing capability to form a high performance transistors as part of the same PIC that is formed on the photonics wafer. Alternatively, in some implementations, a CMOS die 180 (FIG. 10) may be fabricated in a separate fabrication process on a separate wafer, and that wafer can be diced into individual die. The different separated instances of the CMOS die can be flipped onto each receiving footprint on a respective PIC of the photonics wafer (e.g., using a "pick-and-place" machine). A copper pillar, C4 bump, or similar connecting conductive material creates metal connections between the photonic devices in the PIC and the driving electronics in the CMOS die (also called a "flip chip" connection). FIG. 10 shows an example in which the CMOS die 180 is connected to backmetal contacts of a PIC using copper pillars 182.

Power and any necessary digital infrastructure signals for the CMOS die are able to pass through the PIC using these connections, with the PIC acting as an interposer. For example, for controlling or otherwise communicating with devices such as filters, detectors, or a phased array with a large number of phase shifters (e.g., 1,000 or 10,000, or more), electrical control signals (e.g., voltages that set a phase shift value) may be provided using circuitry of the CMOS die that functions as an electronic controller. This may avoid the need for a large number of individual wires connecting to metal contacts on the PIC to control individual phase shifters. The CMOS die 180 can instead be coupled through a smaller number of metal contacts (e.g., fewer than 1,000), and digital data can be streamed serially to the PIC over successive clock cycles and buffered in registers, with digital data (e.g., 8 bits of data for each phase shifter) applied using digital-to-analog converter (DAC) circuits to provide voltages that determine the phase shifts of each phase shifter in the same clock cycle. For a LiDAR system, for example, there may be a delay of 10 microseconds between times when different sets of phase shift values are needed (e.g., for different positions in a field of view), which is a relatively large amount of time for the digital data to be streamed and buffered. The CMOS die can include any of a variety of types of integrated circuits that implement such an electronic controller, such as an application specific integrated circuit (ASIC), a chip that contains a general purpose CPU, a multi-core processor, or a system on a chip (SoC).

Figure 11:
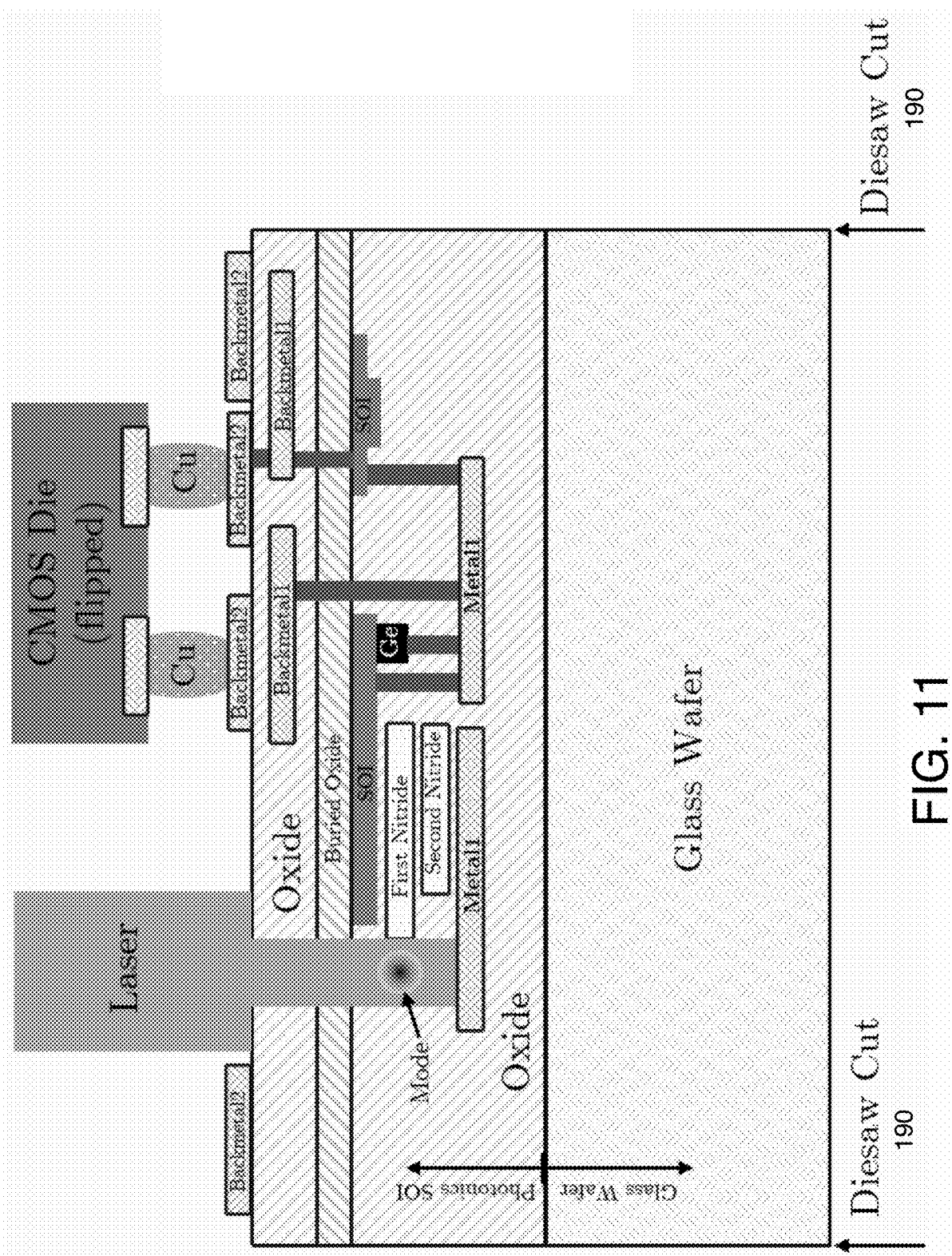

After the connection of each CMOS die to a respective PIC is complete, a die saw can separate the wafer into discrete chips, as shown in FIG. 11 where die saw cuts 190 can produce a chip that includes a PIC die with the attached CMOS die. This may be done if, for example, the CMOS die is smaller than the PIC. However, in alternative fabrication procedures, the photonics wafer can be diced with individual PIC die placed onto different CMOS circuits on a wafer that will be diced after the PIC die are attached.

Figure 12:
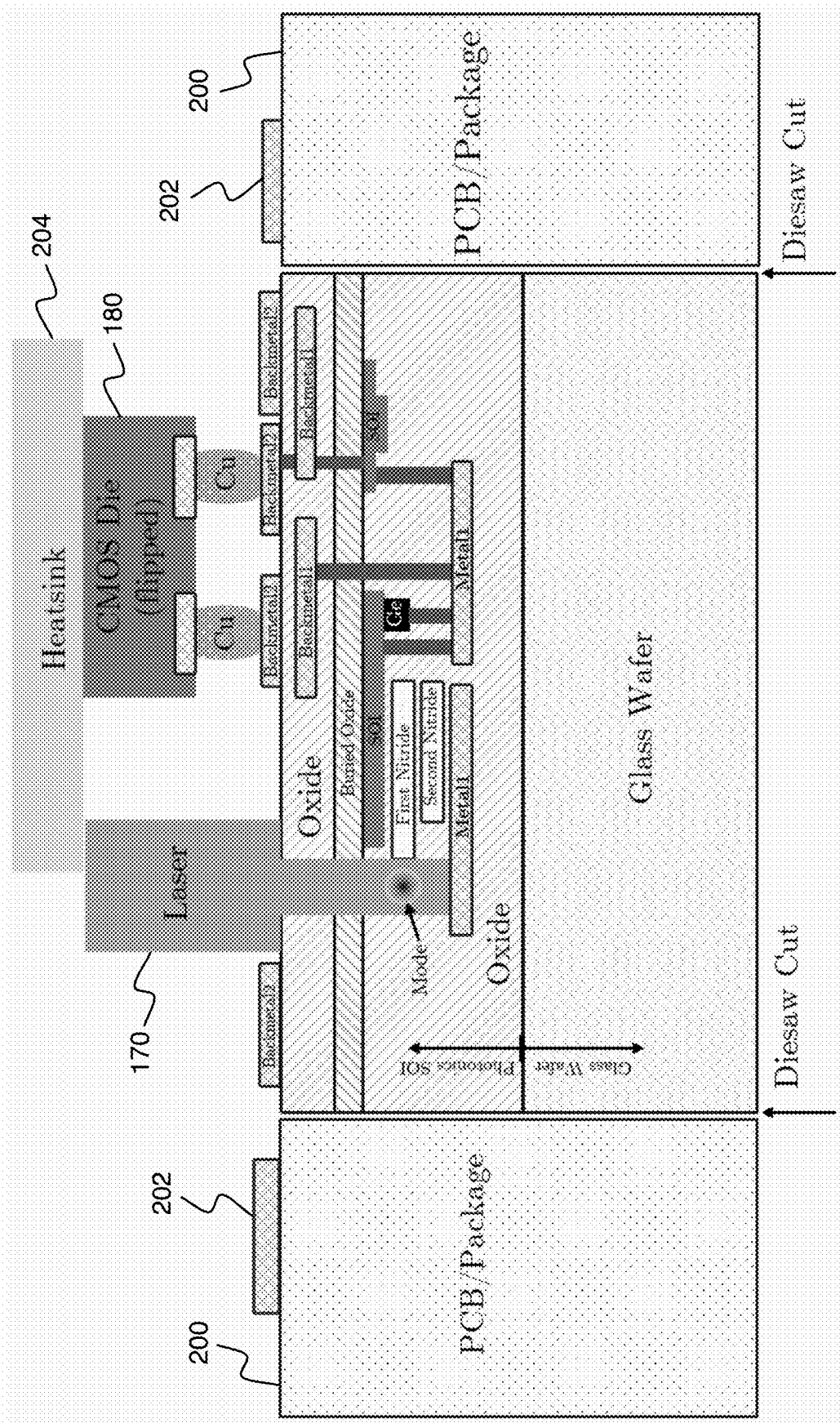
Figure 13:
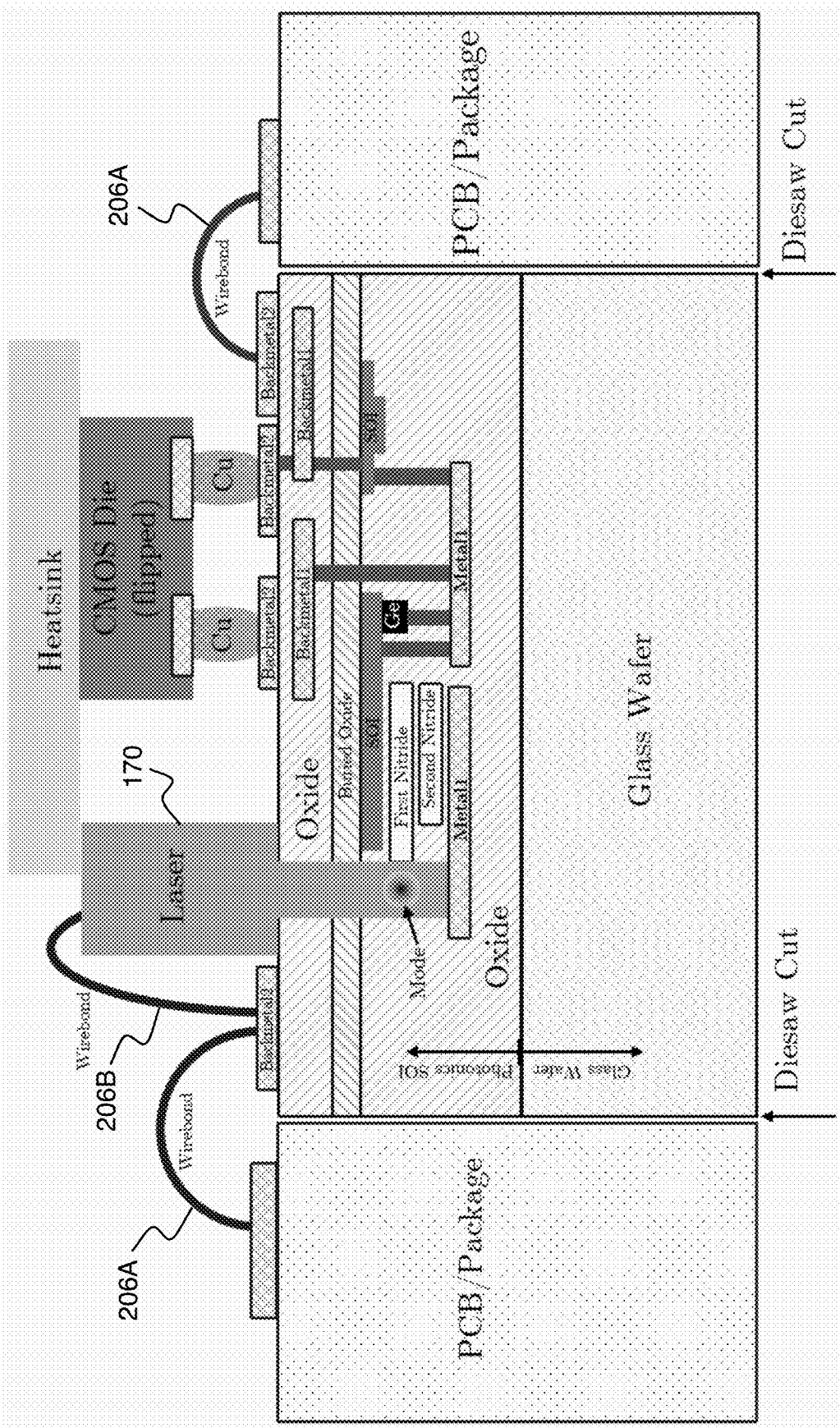

Referring to FIG. 12, some elements within the PIC may need a highly transmissive aperture to be able to emit light for applications such as LiDAR. So, instead of placing the chip on a PCB/package that would obstruct emission through the glass wafer, a PCB/package 200 is used that has an opening in which the chip can be placed and secured to form a packaged device. The opening does not obstruct the clear transmissive pathway that does not include any high-index or other potentially obstructive materials (such as silicon) in proximity to a beam emitted from the PIC (e.g., not within a distance of twice a beam radius from a propagation axis of the beam). A heatsink 204 can also be attached to both the laser module 170 and CMOS die 180, with a substance such as a thermal paste or other thermally conducting compound to help manage temperature of the PIC. In this example, the PCB/package 200 includes contacts 202 that are used to connect to contacts on the chip. Referring to FIG. 13, wirebonds 206A are used to connect the PIC to the surrounding PCB/package, which can be used to program the electronic controller and/or to directly communicate with devices within the PIC. The total number of wirebonds 206A (e.g., fewer than 100) could potentially be smaller than the number of contacts between the CMOS die and the PIC die, depending on procedures used to program the electronic controller. Depending on the packaging arrangement, the PCB/package may be implemented using a PCB with the appropriate slot allowing a clear transmissive pathway for emission from the PIC, or may be another kind of packaging structure that allows light emission and connection to any electrical contacts on the PIC.

One or more wirebonds 206B may also be used to connect to a contact on the top of the laser module 170 to provide pump current to the laser. Since the pump current may be high, the contact on the laser module 170 may be composed of a high conductivity metal such as gold. In alternative implementations, the pump current could be provided directly from a wirebond from the PCB/package to the laser module 170.

Figure 14:
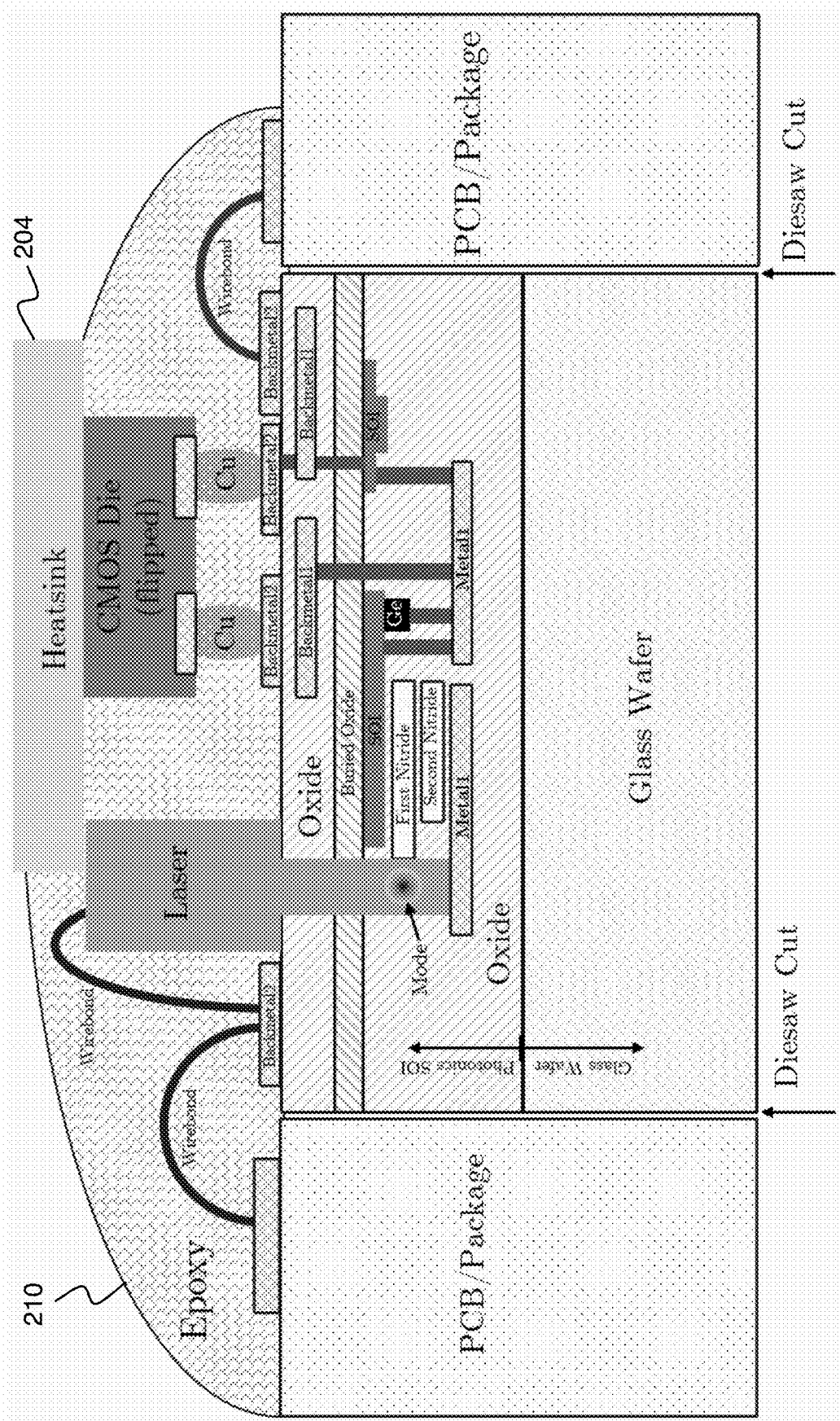

Referring to FIG. 14, a layer of epoxy 210 can be applied to encapsulate the wirebonds to provide protection against abrasion. The epoxy 210 can be cured, for example, by exposure to UV radiation. The heatsink 204 would be kept at least partially exposed to air or an outside structure or environment for proper heat flow. If a gold box and/or hermetic seal is required for protection of the laser or other stability requirements, it can also be added at this stage.

Figure 15:
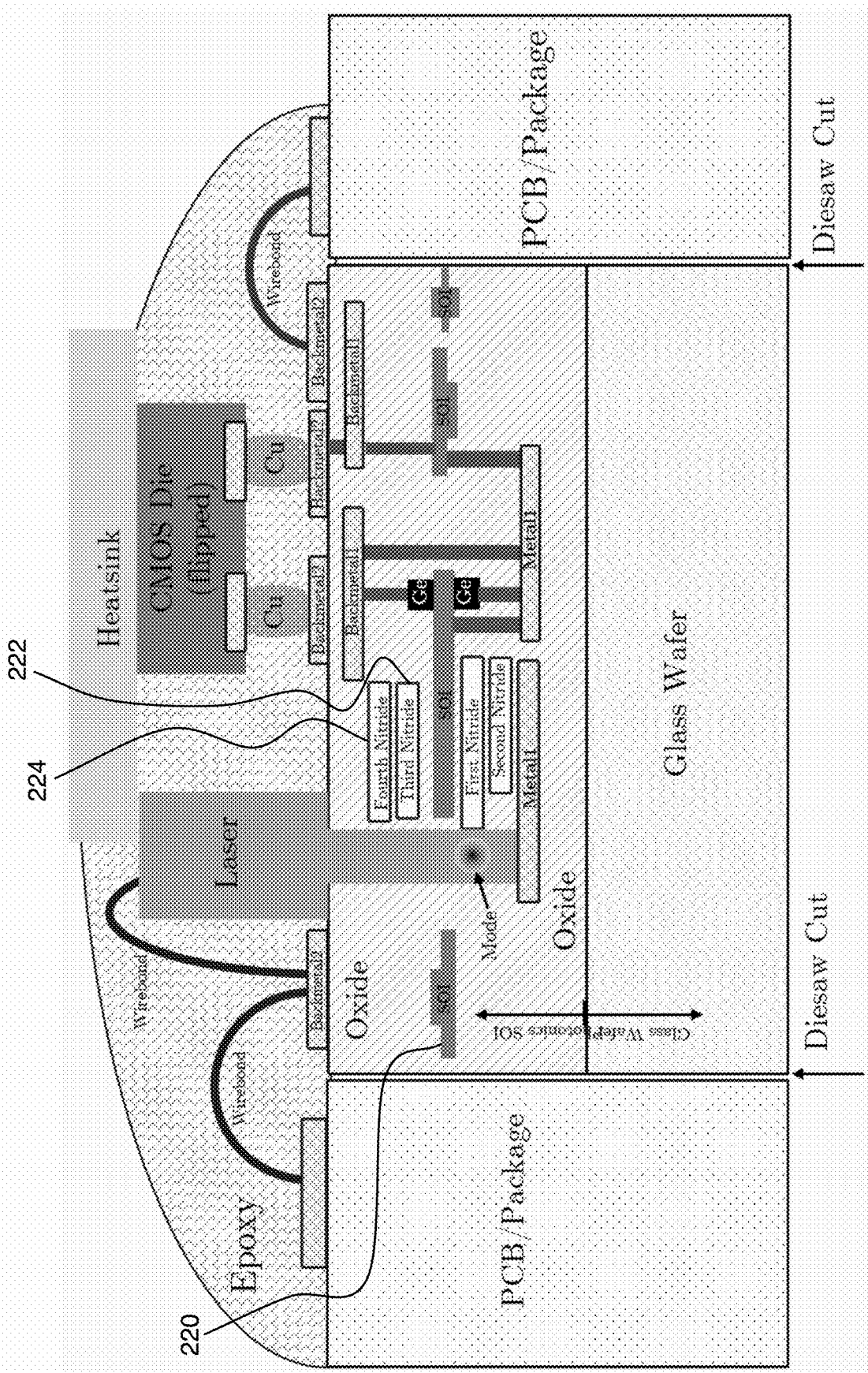
FIG. 15 is a schematic diagram showing an example of an alternative packaged photonic integrated circuit fabricated using an alternative process.

An alternative cross-section of an example packaged device showing features resulting from other fabrication process variants is shown in FIG. 15. In this example, it is shown that the ridge etch, the germanium implant, the nitride deposition, and metallization can occur on both sides of the SOI structures formed in the initial fabrication stages. For example, after the removal of the silicon handle (as shown in FIG. 6), the original BOX layer 106 can also be removed, and additional fabrication stages can be performed before the final metalization stages. In this example, a SOI structure 220 with ridge on the other side has been etched, and a third nitride layer 222 and fourth nitride layer 224 have been deposited between layers of oxide.

Figures 16A, 16B:
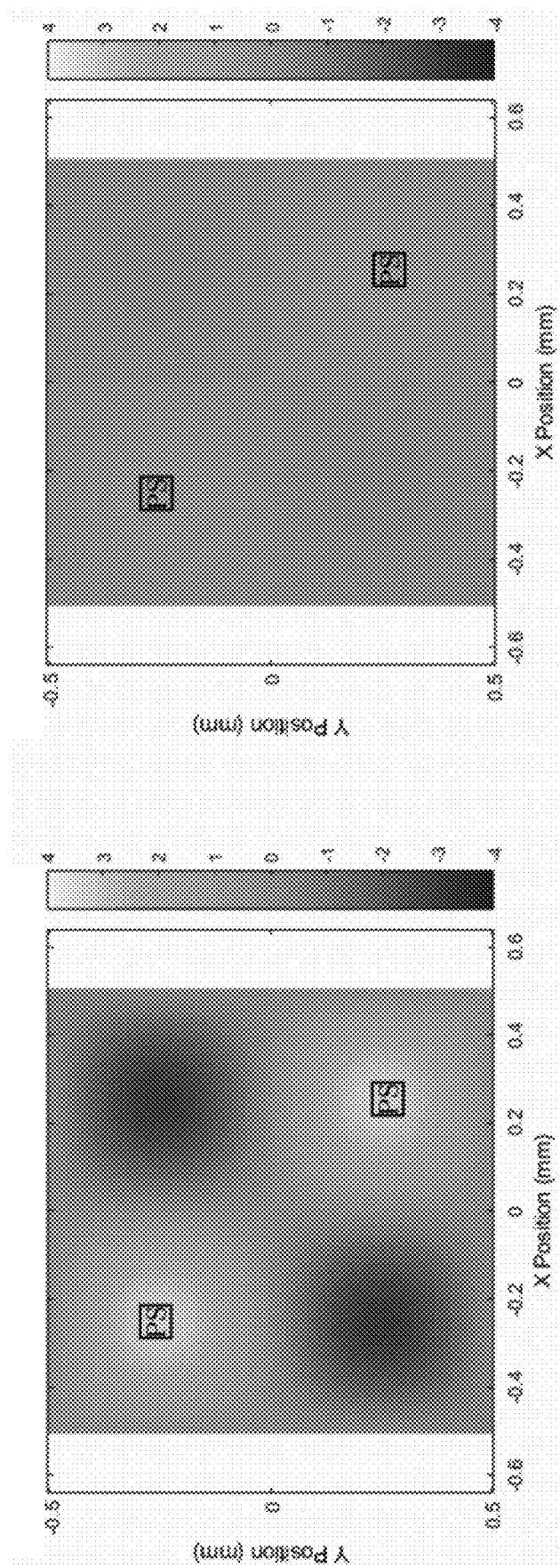
FIGS. 16A and 16B are plots of temperature gradient for a top-down view of an array of phase shifters.
Figures 17A, 17B:
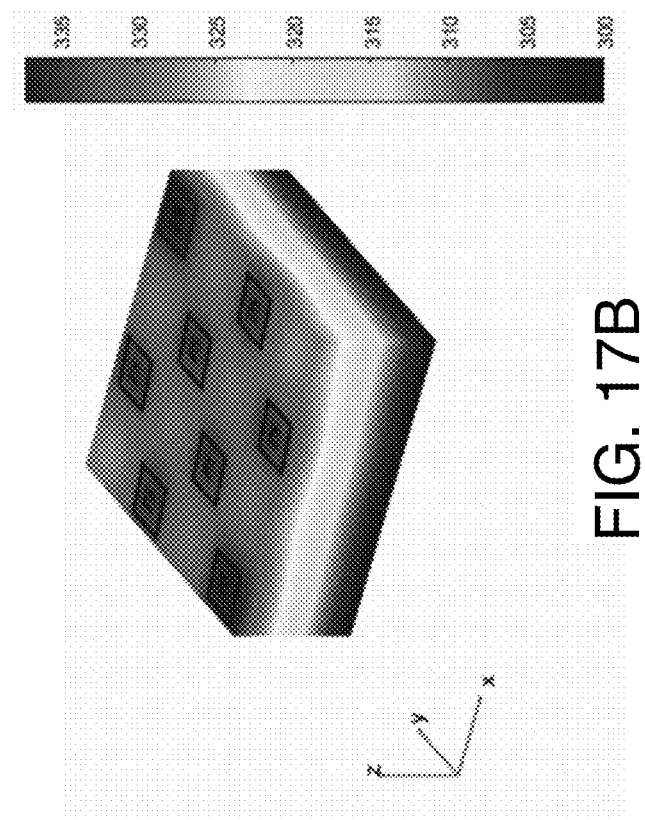
FIGS. 17A and 17B are plots of temperature gradient for an isometric view of an array of phase shifters.

The fabrication techniques described herein can facilitate temperature management for devices in a PIC that may be sensitive to thermal gradients. Optical phased arrays in silicon photonics are often designed with a relatively large number of phase shifters adjacent to one another within an antenna aperture. Phase shifter devices are often thermally sensitive, driving the need to thermally isolate phase shifters from each other as well as from other devices. For example, the phase shifter may include a material whose index of refraction is temperature dependent, and the phase of an optical wave emitted from the phase shifter may depend on that index of refraction. One of the strongest conduction paths of devices that include a silicon handle as a supporting substrate is through the silicon of the supporting substrate. FIG. 16A shows a simulation of temperature deviation vs. position with two phase shifters approximately 800 microns apart acting as heat sources, with the phase shifters sitting atop a thin BOX layer of 2 micron on a silicon handle. FIG. 16B shows a simulation of temperature deviation vs. position with two phase shifters approximately 800 microns apart acting as heat sources, with the phase shifters sitting atop an oxide handle 800 microns thick. Thermal crosstalk is significantly reduced in the oxide handle device compared to the silicon handle device, as shown in FIGS. 16A and 16B. FIGS. 17A and 17B show the same distinction as FIGS. 16A and 17B, respectively, with an isometric view of the temperature gradient surrounding the phase shifters.

Figure 18:
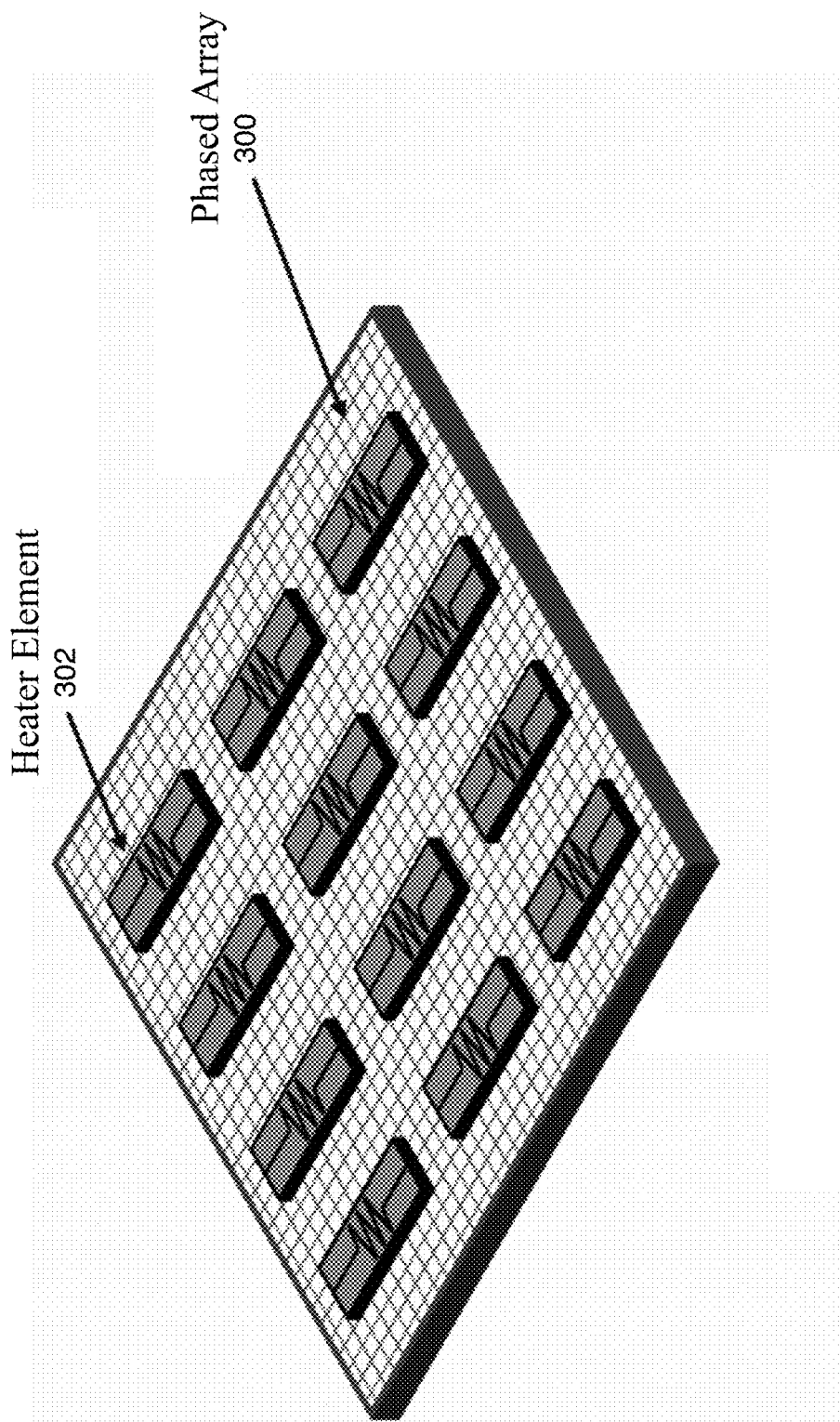
FIG. 18 is a schematic diagram of an array of heater elements distributed over a surface of a portion of a PIC containing an optical phased array.

In addition to residual thermal crosstalk, or thermal gradients due to heat flow, other adverse conditions can affect the performance of devices within a PIC. For example, photonic integrated circuits are sensitive to many sources of process variation, with the cumulative effect of the process variation being a potential decrease in the optical performance of the device within the PIC. For instance, an optical phased array may emit a beam that suffers from a far-field aberration due to the effects of process variation. The beam is formed by interference of optical waves emitted from the phase shifters, and can be steered by changes in the phases of the phase shifters. But, those phases can be altered by the effects of process variation, residual crosstalk, and/or thermal gradients caused by heat flow (e.g., from the laser and/or CMOS die). For any given phased array, to at least partially correct or reduce the aberration, a "prescription" of phase offsets across the antenna aperture can be determined. After reducing the thermal crosstalk by switching the silicon handle to a glass handle, and appropriately separating potential heat sources from the phased array, the phase offsets needed to reduce the aberration may be relatively small (e.g., small enough so that small changes in optical index based on managing local device temperature can induce sufficient phase changes). One approach could be to place a custom lens across the aperture to provide this correction; however, fabricating a custom lens for each array may be cost-prohibitive. In another approach, an array of temperature controlling elements (e.g., heater elements and/or cooling elements) fabricated on the backside of the phased array can create an intentional thermal profile across the phased array to at least partially cancel out the effects of process variation, residual crosstalk, and/or thermal gradients. For example, an array of heater elements could be fabricated for instance as thin-film resistors using the Backmetal1 or Backmetal2 layers, or a custom layer intended for this purpose could be added to the fabrication process flow at any desired depth in the PIC (and any desired distance from a layer containing the phased array). This approach can be used generally to provide process variation or thermal gradient correction to any thermally-sensitive device within the PIC; the approach is not limited to optical phased arrays. FIG. 18 shows an array of correction heater elements 302 fabricated across an optical phased array 300. In this example, there are fewer heater elements than phase shifters, but the heater elements 302 are spaced and arranged in a pattern across the aperture that surrounds the phased array 300 such that the thermal gradient can be reduced to limit the residual far-field aberration of the beam formed by the phased array 300. Other aspects of fabricating or using an array of temperature controlling elements (e.g., heater coils) are described in U.S. patent application Ser. No. 16/260,016, incorporate herein by reference.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for fabricating a photonic integrated circuit, comprising:
forming a plurality of waveguide structures in at least one silicon layer of a first member, the first member including:
a first surface of a first silicon dioxide layer that is attached to a second member that includes a silicon layer at least 100 microns thick; and
a second surface of material that was deposited over at least some of the plurality of waveguide structures;
bonding a third member consisting essentially of an optically transmissive material having a thermal conductivity less than about 50 W/(m·K) to the second surface;
removing most or all of the silicon layer of the second member; and
forming an array of temperature controlling elements in proximity to an array of phase shifters formed in one or more layers of the first member.

2. The method of claim 1, wherein the material that was deposited over at least some of the plurality of waveguide structures consists essentially of silicon dioxide.

3. An article of manufacture, comprising:
a plurality of waveguide structures formed in at least one silicon layer of a first member, the first member including:
a first surface of a first silicon dioxide layer that is attached to a second member that consists essentially of an optically transmissive material having a thermal conductivity less than about 50 W/(m·K); and
a second surface of material that was deposited over at least some of the plurality of waveguide structures;
an array of phase shifters formed in one or more layers of the first member; and
an array of temperature controlling elements in proximity to the array of phase shifters;
wherein the array of phase shifters is configured to emit a beam formed by interference of optical waves emitted from the phase shifters through an aperture that provides a transmissive pathway that does not include obstructive material within a distance of twice a beam radius from a propagation axis of the beam.

4. The article of manufacture of claim 3, wherein most of the transmissive pathway is through the second member.

5. The article of manufacture of claim 3, wherein the first member comprises a wafer, and the second member comprises a wafer.

6. A photonic integrated circuit, comprising:
a plurality of waveguide structures formed in at least one silicon layer of a first member that includes:
a first surface of a first silicon dioxide layer that is attached to a portion of a second member that consists essentially of an optically transmissive material having a thermal conductivity less than about 50 W/(m·K); and
a second surface of material that was deposited over at least some of the plurality of waveguide structures;
a laser module at least partially embedded within a portion of the first member;
a heat sink thermally coupled to the laser module;
an array of phase shifters formed in one or more layers of the first member; and
an array of heater elements in proximity to the array of phase shifters;
wherein the array of phase shifters is configured to emit a beam formed by interference of optical waves emitted from the phase shifters through at least a portion of the second member.

7. The photonic integrated circuit of claim 6, wherein the heater elements are configured to reduce a thermal gradient in proximity to the phase shifters.

8. The method of claim 1, wherein the third member comprises one or more of silicon dioxide, plastic, quartz, or sapphire.

9. The method of claim 1, wherein the bonding comprises direct bonding without any intermediate layer of material between a surface of the third member and the second surface of the first member.

10. The method of claim 1, wherein removing most or all of the silicon layer of the second member comprises removing all of the silicon layer of the second member.

11. The article of manufacture of claim 3, wherein the second member comprises one or more of silicon dioxide, plastic, quartz, or sapphire.

12. The article of manufacture of claim 3, wherein an index of refraction of the optically transmissive material has a low index contrast with the first silicon dioxide layer through which the beam is emitted.

13. The article of manufacture of claim 3, wherein the transmissive pathway does not include metal within a distance of twice a beam radius from a propagation axis of the beam.

14. The article of manufacture of claim 5, wherein the wafer of the first member and the wafer of the second member are direct bonded to each other without any intermediate layer of material between the first surface of the first silicon dioxide layer and a surface of the second member.

15. The photonic integrated circuit of claim 6, wherein the second member comprises one or more of silicon dioxide, plastic, quartz, or sapphire.

16. The photonic integrated circuit of claim 6, wherein an index of refraction of the optically transmissive material has a low index contrast with the first silicon dioxide layer through which the beam is emitted.

17. The photonic integrated circuit of claim 6, further comprising a flip chip connected die connected to conductive contacts of the photonic integrated circuit.

18. The photonic integrated circuit of claim 17, wherein the heat sink is thermally coupled to the flip chip connected die.

19. The photonic integrated circuit of claim 6, further comprising a package in which the photonic integrated circuit is secured and that includes an opening through which the beam is emitted.

20. The photonic integrated circuit of claim 6, wherein the heater elements are formed in at least one layer of the first member, and the heater elements are configured to provide a thermal profile across the array of phase shifters to at least partially cancel out effects of thermal crosstalk among phase shifters of the array of phase shifters.

* * * * *